(12) United States Patent
Huang et al.

(10) Patent No.: US 10,354,874 B2
(45) Date of Patent: Jul. 16, 2019

(54) DIRECTIONAL PROCESSING TO REMOVE A LAYER OR A MATERIAL FORMED OVER A SUBSTRATE

(71) Applicant: Taiwan Semiconductor Manufacturing Co., Ltd., Hsinchu (TW)

(72) Inventors: Shih-Chun Huang, Hsinchu (TW); Chin-Hsiang Lin, Hsinchu (TW); Chien-Wen Lai, Hsinchu (TW); Ru-Gun Liu, Zhubei (TW); Wei-Liang Lin, Hsinchu (TW); Ya Hui Chang, Hsinchu (TW); Yung-Sung Yen, Taipei (TW); Yu-Tien Shen, Tainan (TW); Ya-Wen Yeh, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/812,750

(22) Filed: Nov. 14, 2017

(65) Prior Publication Data
US 2019/0148145 A1 May 16, 2019

(51) Int. Cl.
*H01L 21/3065* (2006.01)
*H01L 21/033* (2006.01)
*H01L 21/311* (2006.01)
*H01L 21/3213* (2006.01)
*H01L 21/768* (2006.01)
*H01L 21/3105* (2006.01)

(52) U.S. Cl.
CPC ...... *H01L 21/0337* (2013.01); *H01L 21/0332* (2013.01); *H01L 21/31056* (2013.01); *H01L 21/31116* (2013.01); *H01L 21/32139* (2013.01); *H01L 21/76843* (2013.01)

(58) Field of Classification Search
CPC ......... H01L 21/76843; H01L 21/31056; H01L 21/32139; B81C 2201/0136
USPC ............. 438/696, 717, 725, 736; 216/62, 66
See application file for complete search history.

(56) References Cited

U.S. PATENT DOCUMENTS

| 5,190,887 A | * | 3/1993 | Tang | ................. H01L 21/26586 |
| | | | | 257/E21.345 |
| 9,146,469 B2 | | 9/2015 | Liu et al. | |
| 9,905,754 B1 | * | 2/2018 | Yoon | ....................... H01L 43/12 |

(Continued)

*Primary Examiner* — Binh X Tran
(74) *Attorney, Agent, or Firm* — McDermott Will & Emery LLP (57) ABSTRACT

A method of fabricating a semiconductor device includes forming a hard mask layer over a substrate. A multi-layer resist is formed over the hard mask layer. The multi-layer resist is etched to form a plurality of openings in the multi-layer resist to expose a portion of the hard mask layer. Ion are directionally provided at an angle to the multi-layer resist to predominately contact sidewalls of the plurality of openings in the multi-layer resist rather than the hard mask layer. In one embodiment, the multi-layer resist is directionally etched by directing etch ions at an angle to predominately contact sidewalls of the plurality of openings in the multi-layer resist rather than the hard mask layer. In another embodiment, the multi-layer resist is directionally implanted by directing implant ions at an angle to predominately contact sidewalls of the plurality of openings in the multi-layer resist rather than the hard mask layer.

20 Claims, 11 Drawing Sheets

(56) References Cited

U.S. PATENT DOCUMENTS

| | | |
|---|---|---|
| 2011/0300711 A1 | 12/2011 | Martin et al. |
| 2012/0028468 A1 | 2/2012 | Cheng et al. |
| 2015/0187580 A1 | 7/2015 | Chen et al. |
| 2015/0318381 A1 | 11/2015 | Tsai et al. |
| 2017/0018458 A1 | 1/2017 | Cheng et al. |

* cited by examiner

DIRECTIONAL PROCESSING TO REMOVE A LAYER OR A MATERIAL FORMED OVER A SUBSTRATE

BACKGROUND

The semiconductor integrated circuit (IC) industry has experienced rapid growth. Technological advances in IC materials and design have produced device scaling in which IC geometry size, such as decreasing feature size and pitch, is reduced. However, decreasing feature size and pitch can lead to collapse of photoresist features used in the manufacture of ICs.

Along with decreasing geometry size, ICs have increased in complexity. Dual-damascene interconnect features include planarized interconnect structures and multiple interconnect layers increasing the complexity of device integration. Low-dielectric constant (low-k) dielectric materials are being used in conjunction with copper dual-damascene interconnect features. Some low-k dielectric materials are porous, and it is difficult to adequately control the etch process, particularly in the dual-damascene structure and manufacturing processes.

There is a need for improved processes, materials, and structures in the removal of layer and materials to manufacture advanced ICs with decreasing geometry size and with increased complexity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
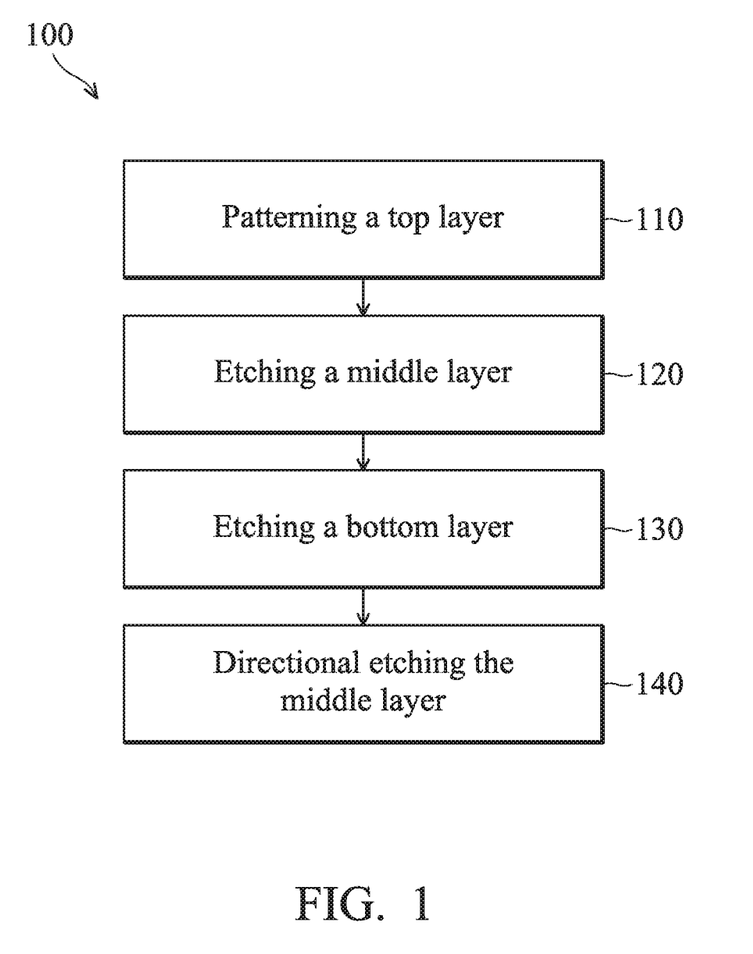
FIG. 1 is a method of using directional processing to remove a layer or a material formed over a substrate, in accordance with some embodiments.

FIG. 1 illustrates one embodiment of a method 100 of using directional processing to remove a layer or a material formed over a substrate. The substrate may be a semiconductor substrate, such as silicon, germanium, silicon germanium, silicon carbide, gallium arsenide, indium arsenide, indium phosphide, and/or other suitable materials. The substrate may be a non-semiconductor substrate such as glass, silica, quartz, alumina, sapphire, aluminum nitride, and/or other suitable materials. The substrate may be a silicon-on-insulator (SOI) substrate. The substrate may include a plurality of layers (such as conductive layers, semiconductive layers, insulating layers, and other suitable layers) and/or features (doped regions or wells, source/drain regions, isolation regions, shallow trench isolation (STI) feature, gate structures, interconnect lines, vias, and other suitable features) formed in, on, and/or over the substrate. The plurality of layers and/or features are used in the fabrication of semiconductor devices and integrated circuits. The substrate may also include subsequent materials formed in, on, and/or over the substrate in the blocks of the methods and in the figures of the present disclosure.

Figure 2A:
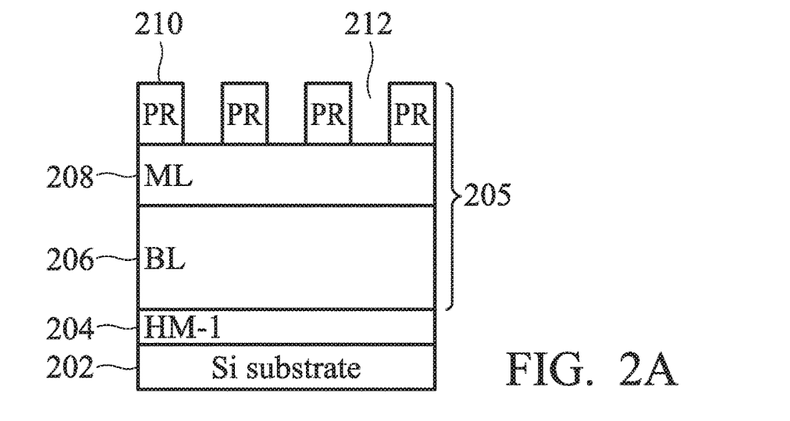
FIGS. 2A-2C are schematic diagrams of a substrate processed by the method of FIG. 1 or FIG. 3, in accordance with some embodiments.

FIG. 2A is a schematic diagram illustrating one embodiment of a substrate 202 processed by the method 100 of FIG. 1. The substrate 202 includes one or more layers and/or features disposed therein protected by a hard mask layer 204 formed over substrate 202. The hard mask layer 204 may define a pattern to be transferred to the substrate 202 during subsequent processing. The hard mask layer 204 may be made of a metal layer, a metal oxide layer, a metal nitride layer (such as a titanium nitride (TiN) layer), a nitride layer (such as a silicon oxynitride (SiON) layer), an oxide layer (such as a silicon oxide ($SiO_2$) layer), or multiple layers thereof. The hard mask layer 204 may be deposited by chemical vapor deposition (CVD), such as low pressure CVD or plasma enhanced CVD, by atomic layer deposition (ALD), or by physical vapor deposition (PVD). The hard mask layer 204 may be deposited to any suitable thickness, such as between about 200 Å and about 1,400 Å

One application of the hard mask layer 204 is to be deposited over a low-k dielectric layer to preserve the integrity or prevent pattern collapse of patterned lines and vias in the low-k dielectric layer. Another application of the hard mask layer 204 is to provide CD line width control and via overlay alignment. In still another application, the hard mask layer 204 helps achieve small feature size, for example feature sizes of 40 nm and below. In still yet another application, the hard mask layer 204 provides high etch selectivity which helps to transfer a pattern to the hard mask layer.

In block 110 of the method 100, a multi-layer resist 205 is formed over the hard mask layer 204. The multi-layer resist 205 comprises a bottom layer 206, a middle layer 208 formed over the bottom layer, and a top layer 210 formed over the middle layer. The top layer 210 is patterned (i.e., exposed and developed) to form a plurality openings 212 within the top layer 210.

As shown in FIG. 2A, the top layer 210 comprises a photoresist layer. One application of using a multi-layer resist with the top layer 210 comprising a photoresist layer is to reduce poisoning of the photoresist layer by amines generated during etching layers below the photoresist layer.

One embodiment of the multi-layer resist 205 includes the bottom layer 206 comprised of a $C_xH_yO_z$ material, the middle layer 208 comprised of a $SiC_xH_yO_z$ material, and the top layer 210 comprised of a second $C_xH_yO_z$ material and a photo-sensitive element, such as a photo-acid generator (PAG) and/or a photo-base generator (PBG). In another embodiment, the multi-layer resist 205 includes the bottom layer 206 comprised of a silicon rich oxide and/or silicon oxycarbide (SiOC), the middle layer 207 comprised of a silicon-based material, such as silicon nitride, silicon oxynitride, and/or silicon oxide, and the top layer 210 comprised of a photoresist layer. Examples of photoresist materials include polymethyl methacrylate (PMMA), polymethyl glutarimide) (PMGI), siloxane polymer, phenol formaldehyde resin (DNQ/Novolac), SU-8 photoresist, other suitable positive tone photoresist material, and other suitable negative tone photoresist material.

In a photolithography process, the chemical properties of the photoresist regions struck by incident radiation change in a manner that depends on the type of photoresist used. For example, the photoresist layer may be a suitable positive tone resist or may be a suitable negative tone resist. Positive tone photoresist materials become soluble to developer when exposed to radiation (typically UV light). Negative tone resist materials become insoluble to developer when exposed to radiation (typically UV light).

The layers of the multi-layer resist 205 may be deposited by spin coating, by CVD, ALD, evaporation, or any suitable deposition technology. The layers of the multi-layer resist 205 may be deposited to any suitable thicknesses, such as a thickness between 50 Å to 20,000 Å, depending on the features to be filled and the desired lithography process. In addition, one or more layers of the multi-layer resist 205 may undergo a baking process, such as a soft-baking process to remove solvent used during deposition and/or a post exposure bake to promote adhesion and/or cross-linking induced by an exposure.

Each layer of the multi-layer resist 205 may comprise a material selected depending on the lithography processes desired. In other embodiments, any one or more of the layers of the multi-layer resist may include a photo-sensitive element. It is understood that in other embodiments, one or more layers of the multi-layer resist 205 may be omitted or additional layers may be provided as a part of the multi-layer resist 205. Although multi-layer resist 205 is shown as a tri-layer resist in FIG. 2A, the multi-layer resist may be a tetra-layer resist, a penta-layer resist, a hexa-layer resist, or a resist of more than six layers.

In block 120 of the method 100, the middle layer 208 is etched through the openings 212 of the top layer 210. As shown in a schematic diagram of FIG. 2B, the top layer 210 serves as a mask in the etching process to prevent etching of portions of the middle layer 208 to form openings 218 in the middle layer. The etching process may involve a plasma process, such as an inductively coupled plasma (ICP), parallel place plasma, ion beam etching (IBE), or reactive ion beam etching (RIBE) plasma process. The etching process includes an etching gas, such as oxygen ($O_2$), nitrogen ($N_2$), argon (Ar), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), sulfur hexafluoride ($SF_6$), nitrogen trifluoride ($NF_3$), chlorine ($Cl_2$), HCl (hydrogen chloride), $BCl_3$ (boron trichloride), other suitable reactive gases, and combinations thereof. The etching process may be an anisotropic etch forming vertical sidewalls to the openings 218 in the middle layer 208. For example, an anisotropic etch may be achieved by applying a bias to the substrate during etching and/or by directing etch ions in an IBE or RIBE etch vertically towards the substrate. Other etch process parameters include plasma source power, etch chamber pressure, flow rate of etchant gases, substrate temperature, and other suitable process parameters. The etching process may also remove the top layer 210.

In block 130 of the method 100, the bottom layer 206 is etched through the openings 218 of the middle layer 208. As shown in a schematic diagram of FIG. 2C, the middle layer 208 serves as a mask in the etching process to prevent etching of portions of the bottom layer 206 while forming openings 226 in the bottom layer 206. The etching process may involve an etch chemistry which has greater etch selectivity to the bottom layer 206 than to the middle layer 208. Due to the etch selectively to the bottom layer 206, a portion of the middle layer 208 remains. The etching process may involve a plasma process, such as an ICP, parallel place plasma, IBE, or RIBE plasma process. The etching process includes an etching gas, such as $O_2$, $N_2$, Ar, $C_2F_6$, $CF_4$, $CHF_3$, $CH_2F_2$, $C_3F_8$, $C_4F_8$, $SF_6$, $NF_3$, $Cl_2$, HCl, $BCl_3$, other suitable reactive gases, and combinations thereof. The etching process may be an anisotropic etch forming vertical sidewalls to the openings 226 in the bottom layer 206.

In block 140 of the method 100, a directional etch is performed to remove the middle layer 208. As shown in schematic diagram of FIG. 3, during the directional etch, the etch ions are directed at an angle ($\alpha$) 302 so that the bottom layer 206 provides a shadowing effect to reduce the amount of etch ions impacting the hard mask layer 204. For example, the angle 302 may be in a range from 2 degrees to 75 degrees. The angle 302 of the directional etch may be chosen based upon the aspect ratio (depth over width) of the opening 226 in the bottom layer 206. If the aspect ratio is high, then the etch ions may be directed at a small angle 302, such as in a range from 5 degrees to 30 degrees, during directional etching. If the aspect ratio is low, then the etch ions may be directed at a large angle 302, such as in a range from 30 degrees to 60 degrees, during directional etching.

Figure 3:
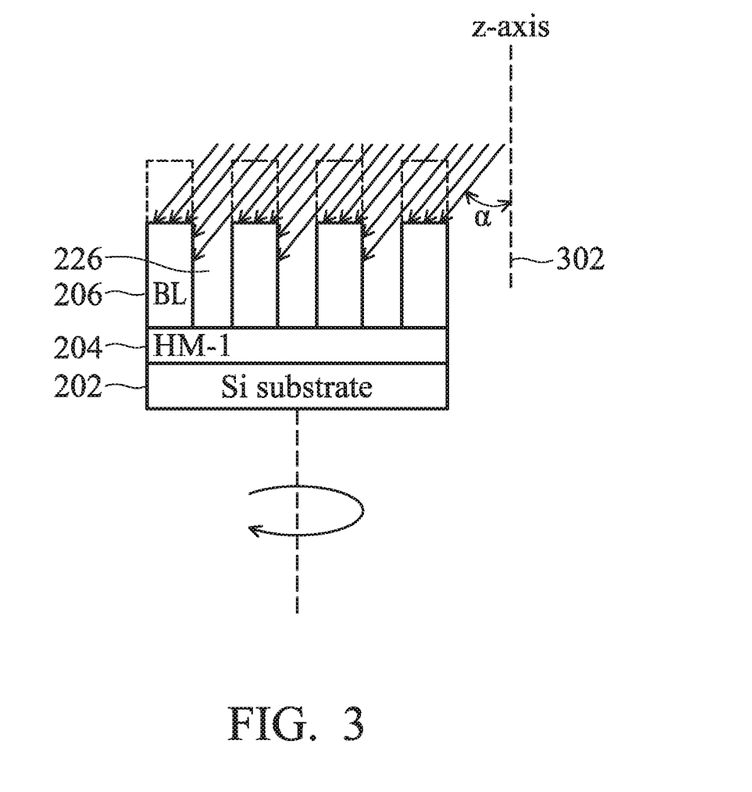
FIG. 3 is a schematic diagram of directional etching of a substrate, in accordance with some embodiments.

The directional etch may be performed using an IBE or an RIBE process. One example of an etch chamber suitable to perform directional etching in an IBE or an RIBE process is a NEXUS Ion Beam Etch System from Veeco Instruments Inc. with headquarters in Plainview, N.Y. The IBE process may include an inert gas, such as argon gas, to generate ions which are collimated and directed to the substrate. The RIBE process may include a reactive gas with or without an inert gas. Reactive etchant gases includes, but is not limited to, $O_2$, $C_2F_6$, $CF_4$, $CHF_3$, $CH_2F_2$, $C_3F_8$, $C_4F_8$, $SF_6$, $NF_3$, $Cl_2$, HCl, $BCl_3$, other suitable reactive gases, and combinations thereof.

The angle 302 of the ions during the IBE process or RIBE process may be controlled by tilting the substrate 202 with respect to an ion source, such as a collimated ion beam source. The substrate may rotate with respect to the ion source so that the substrate 202 may be uniformly etched by etch ions directed at the angle 302 along the z-axis.

In certain embodiments, the directional etch removes the middle layer 208 with reduced damage to the hard mask layer 204. Due to the shadowing effect of the bottom layer 206, the etch ions directed at an angle 302 predominately impinges the middle layer 208 and the bottom layer 206 rather than the hard mask layer 204. The hard mask layer 204 may be easily damaged by dry or wet non-directional etch processes to remove the middle layer 208. For example, the middle layer 208 may comprise a silicon-containing resist layer and the hard mask layer 204 may comprise a silicon-containing hard mask layer. Therefore, etch contrast or selectivity between the middle layer 208 and the hard mask layer 204 is poor resulting in damage to the hard mask layer during non-directional etching of the middle layer 208. With directional etching of the middle layer 208, in which the etch ions are directed at an angle 302, the bottom layer 206 provide a shadowing effect which reduces the amount of etch ions impacting the hard mask layer 204 and reduces damage to the hard mask layer 204. By directionally etching, high etch selectively of the middle layer 208 rather than the hard mask layer 204 may be provided even if the etch chemistry is selective to both the middle layer 208 and the hard mask layer 204. After removal of the middle layer 208, the bottom layer 206 may be used to pattern the hard mask layer 204 and/or to form additional features in the manufacture of an integrated circuit.

In the method 100, one or more blocks may be performed in-situ in the same chamber. For example, the etching of the middle layer 208 in block 120 and the etching of the bottom layer 206 in block 130 may be performed in the same chamber. For example, an etch chemistry and/or other etch process conditions (such as plasma source power, etch chamber pressure, flow rate of etchant gases, substrate bias) may be changed from the etch in block 120 versus the etch in block 130. In another example, the etching of the bottom layer in block 130 and the directional etch in block 140 may occur in-situ in the same chamber by conducting a first etch with the etch ions directed at an angle of 0 (zero) and by conducting a second etch with the etch ions directed at an angle 302 of greater than 0 (zero).

Figure 4:
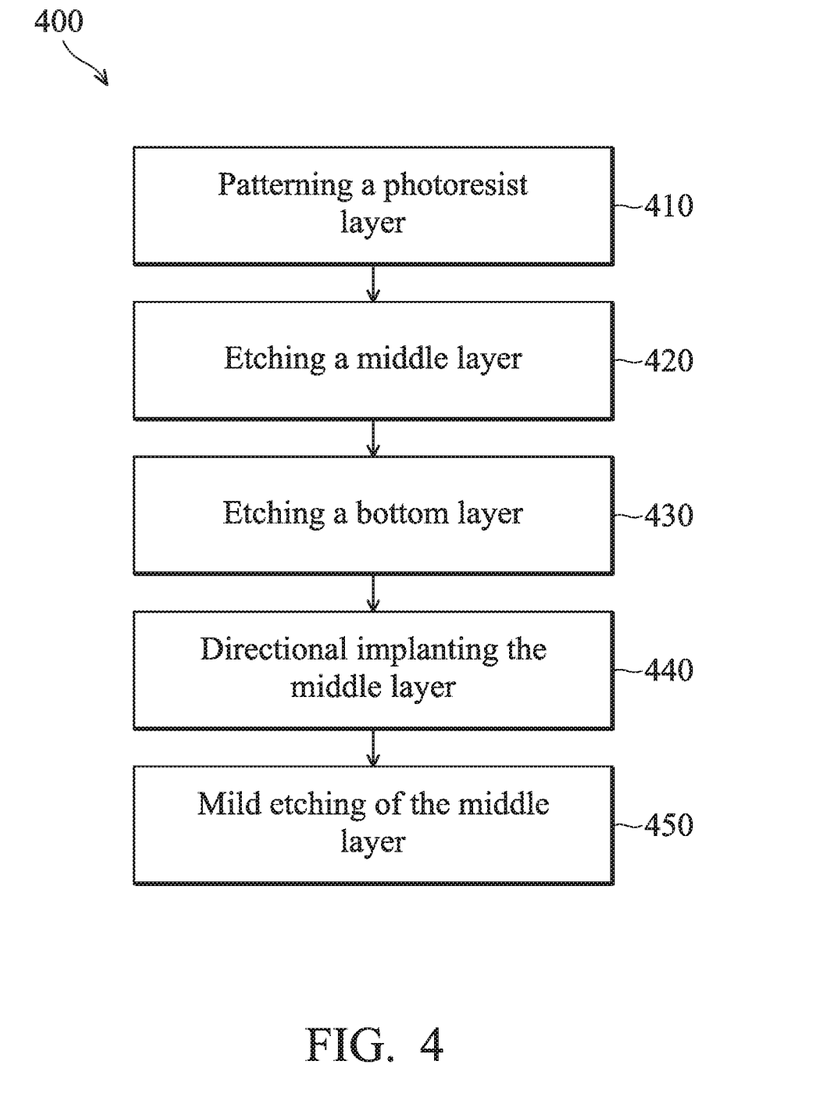
FIG. 4 is another method of using directional processing to remove a layer or a material formed over a substrate, in accordance with some embodiments.

FIG. 4 illustrates another embodiment of a method 400 of using directional processing to remove a layer or a material formed over a substrate. FIG. 2A also illustrates one embodiment of a substrate 202 processed by the method 400 of FIG. 4.

In block 410 of the method 400, a multi-layer resist 205 is formed over the hard mask layer 204. The multi-layer resist 205 comprises a bottom layer 206, a middle layer 208 formed over the bottom layer, and a top layer 210 formed over the middle layer. The top layer 210 is patterned (i.e., exposed and developed) to form a plurality openings 212 within the top layer 210.

Figure 2B:
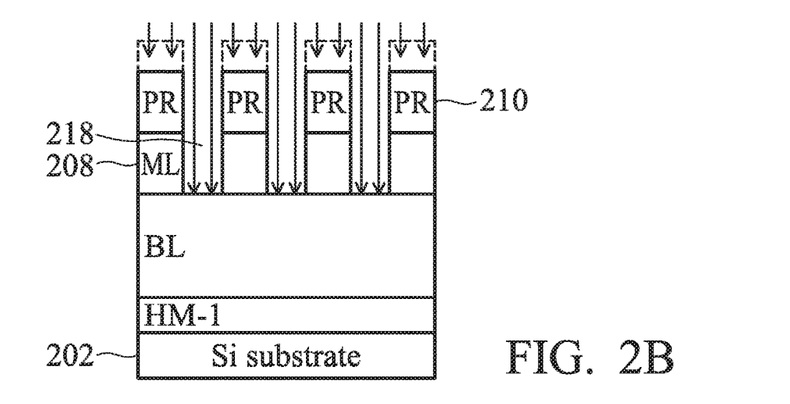

In block 420 of the method 400, the middle layer 208 is etched through the openings 212 of the top layer 210. Also as shown in FIG. 2B, the top layer 210 serves as a mask in the etching process to prevent etching of portions of the middle layer 208 to form openings 218 in the middle layer. The etching process may involve a plasma process, such as an ICP, parallel place plasma IBE, or RIBE plasma process. The etching process includes an etching gas, such as $O_2$, $N_2$, Ar, $C_2F_6$, $CF_4$, $CHF_3$, $CH_2F_2$, $C_3F_8$, $C_4F_8$, $SF_6$, $NF_3$, $Cl_2$, HCl, $BCl_3$, other suitable reactive gases, and combinations thereof. The etching process may be an anisotropic etch forming vertical sidewalls to the openings 218 in the middle layer 208. The etching process may also remove the top layer 210.

Figure 2C:
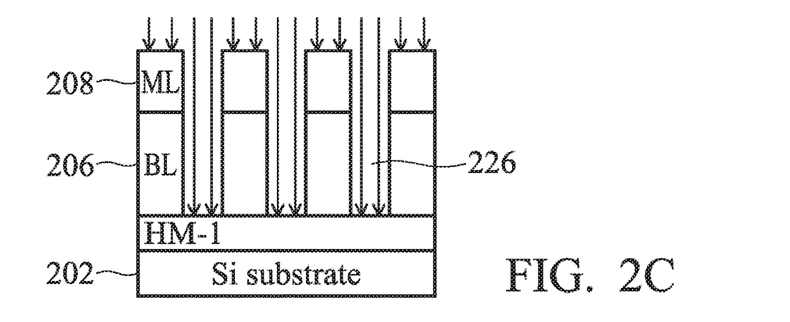

In block 430 of the method 400, the bottom layer 206 is etched through the openings 218 of the middle layer 208. Also as shown in FIG. 2C, the middle layer 208 serves as a mask in the etching process to prevent etching of portions of the bottom layer 206 to form openings 226 in the bottom layer. The etching process involves an etch chemistry which has greater etch selectivity to the bottom layer 206 than to the middle layer 208. Due to the etch selectively to the bottom layer 206, a portion of the middle layer 208 remains. The etching process may involve a plasma process, such as a inductively coupled plasma (ICP), parallel place plasma, and reactive ion beam etching. The etching process may involve a plasma process, such as an ICP, parallel place plasma, IBE, or RIBE plasma process. The etching process includes an etching gas, such as $O_2$, $N_2$, Ar, $C_2F_6$, $CF_4$, $CHF_3$, $CH_2F_2$, $C_3F_8$, $C_4F_8$, $SF_6$, $NF_3$, $Cl_2$, HCl, $BCl_3$, other suitable reactive gases, and combinations thereof. The etching process may be an anisotropic etch forming vertical sidewalls to the openings 226 in the bottom layer 206.

In block 440, a directional implant is performed. As shown in a schematic diagram of FIG. 5A, during the directional implant, the implant ions are directed at an angle ($\alpha$) 502 so that the middle layer 208 provides a shadowing effect to reduce the amount of implant ions impacting the bottom layer 206 and the hard mask layer 204. For example, the angle 502 may be in a range from 2 degrees to 75 degrees. The angle 502 of the directional implant may be chosen based upon the aspect ratio (depth over width) of the opening 218 in the middle layer 208. If the aspect ratio is high, then the implant ions may be directed at a small angle 502, such as a range from 5 degrees to 30 degrees, during directional implanting. If the aspect ratio is low, then the implant ions may be directed at a large angle 502, such as a range from 30 degrees to 60 degrees, during directional implanting. Due to the shadowing effect of the middle layer 208, no or a relatively few amount of implant ions impact the bottom layer 206. Therefore, the material properties of the bottom layer 206 are unchanged, and the bottom layer 206 may act as a mask for subsequent processing of the hard mask layer 204.

Figure 5A:
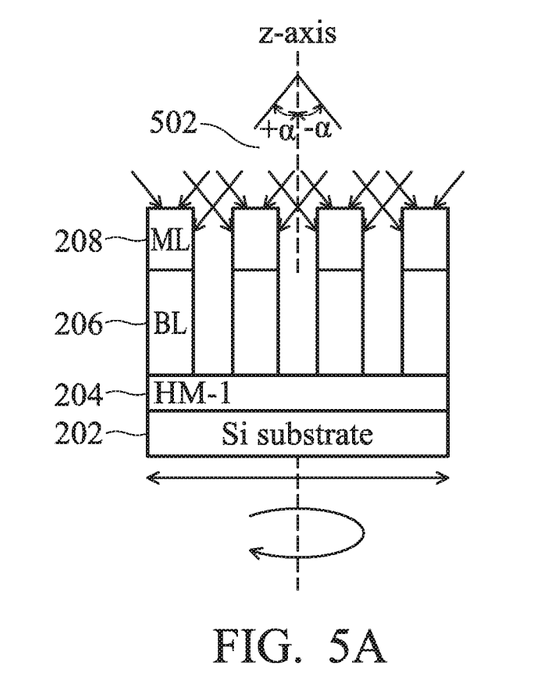
FIG. 5A is a schematic diagram of directional implanting of a substrate, in accordance with some embodiments.

A directional implant may be implemented with ion implanting equipment having the ability to tilt and rotate substrates to a predetermined angle of incidence with the dopant species. One suitable directional implant chamber is a Purion implant chamber from Axcelis Technologies, Inc. with headquarters in Beverly, Mass. The directional implant may include dopant implant species, such as boron (B), Arsenic (As), phosphorus (P), boron trifluoride ($BF_3$), indium antimonide (InSb), indium arsenide (InAs) and/or may include non-dopant implant species, such as germanium (Ge), silicon (Si), carbon (C), nitrogen (N), or combinations thereof. The ions may be implanted at a certain implant voltage (energy) depending on the depth of implant and doped density desired, such as an implant voltage in a range from 500 eV to 1 MeV in certain embodiments.

The angle 502 of the ions during directional implant may be controlled by tilting the substrate 202 with respect to an ion implant source. The substrate 202 may rotate with respect to the implant ion source so that the middle layer 208 is uniformly implanted. In other embodiments, the angle 502 of the ions during directional implant may be controlled by an electric field applied to ion implant ions. For example, the ions may be deflected at a positive angle (+α) 502 for a certain period and deflected at a negative angle (−α) 502 for a certain period of time to uniformly implant the middle layer 208. In one embodiment, the implant ions during directional implant may be provided from an ion beam ribbon. The ion beam ribbon may be scanned with respect to the substrate 202, such as deflecting the ion beam ribbon in an electric field or by relative motion of the substrate. The ion beam ribbon may be scanned with respect to the substrate 202, such as deflecting the ion beam ribbon in an electric field or by relative motion of the substrate 202. In other embodiments, the implant ions during directional implant may be provided from a bulk ion beam directed to the entire surface of the substrate 202.

The directional implant changes the properties of the middle layer 208. For example, the directional implant may soften the middle layer 208 or make the middle layer 208 easier to etch. The angle of incidence of the implant ions during the directional implant process may be controlled and modified so that the implant ions contact the middle layer 208 rather than the bottom layer 206 and the hard mask layer 204.

Figure 5B:
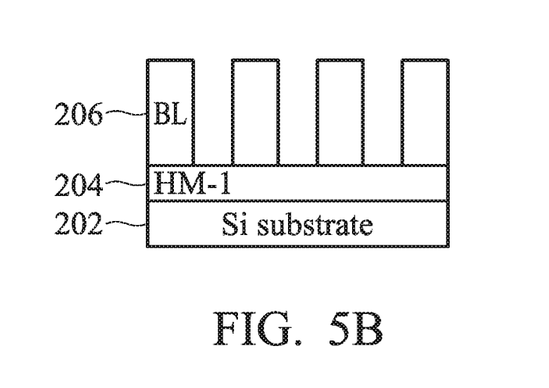
FIG. 5B is a schematic diagram of ashing of a substrate, in accordance with some embodiments.

In block 450, a mild etch is performed to remove the middle layer 208 resulting in the substrate 202 shown in FIG. 5B. For example, a mild dry ashing process may be performed in which the middle layer 208 is exposed to an $O_2$ plasma to convert the middle layer 208 comprised of carbon to carbon dioxide dry etch by-products. In another example, a mild wet etch stripping process may be performed to remove the middle layer 208 in which a solution of sulfuric acid ($H_2SO_4$) and hydrogen peroxide ($H_2O_2$) is used to convert the middle layer 208 comprised of carbon to carbon dioxide wet etch by-products.

The mild etch removes the middle layer 208 with reduced damage to the hard mask layer 204. Due to the shadowing effect of the middle layer 208 during directional implant in block 440, the implant ions directed at an angle 502 predominately impinges the middle layer 208 rather than the bottom layer 206 and the hard mask layer 204. The hard mask layer 204 may be easily damaged by dry or wet etch processes to remove the middle layer 208 without being implanted. For example, the middle layer 208 may comprise a silicon-containing resist layer and the hard mask layer 204 may comprise a silicon-containing hard mask layer. Therefore, etch contrast or selectivity between the middle layer 208 and the hard mask layer 204 may be poor without the directional implant resulting in damage to the hard mask layer during removal of the middle layer 208. With directional implanting to the middle layer 208 in which the implant ions are directed at an angle 502 in block 440, the middle layer 208 provides a shadowing effect which reduces the amount of implant ions impacting the bottom layer 206 and the hard mask layer 204. By directionally implanting, high etch selectivity of the middle layer 208 versus the hard mask layer 204 may be provided by softening or changing the properties of the middle layer 208. In the mild etch in block 450, the softened middle layer 208 is removed with reduced damage to the hard mask layer 204. In certain embodiments, since the bottom layer 206 and the hard mask layer 204 are not implanted, the bottom layer 206 and the hard mask layer 204 are resistant to the mild etch in block 450. After removal of the middle layer 208, the bottom layer 206 may be used to pattern the hard mask layer 204 and/or to form additional features in the manufacture of an integrated circuit.

Figure 6:
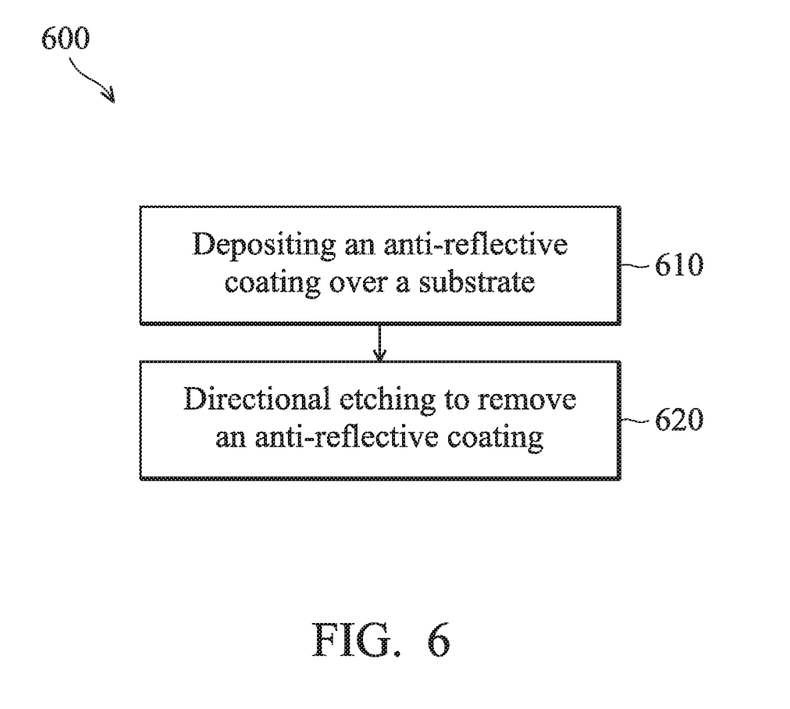
FIG. 6 is still another method of using directional processing to remove a layer or a material formed over a substrate, in accordance with some embodiments.
Figure 7A:
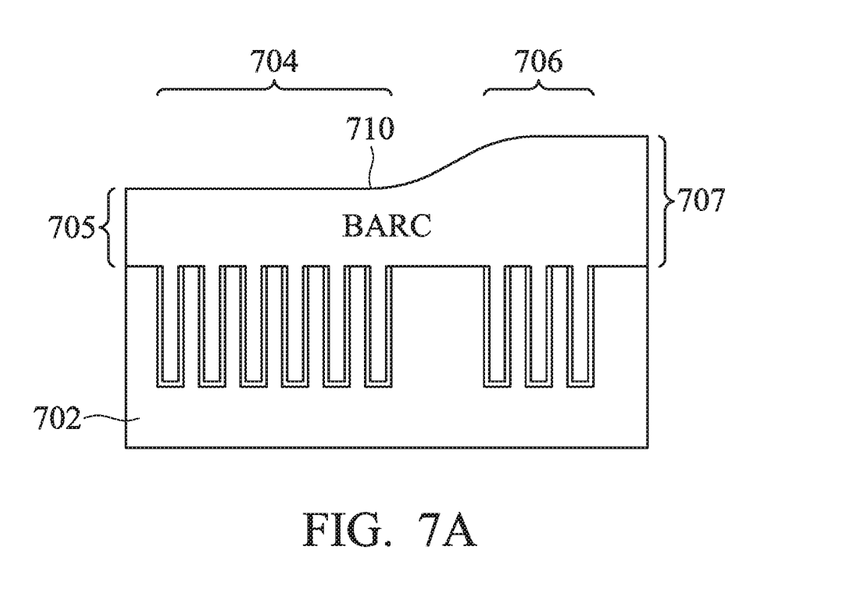
FIGS. 7A-7D are schematic diagrams of a substrate processed by the method of FIG. 6, in accordance with some embodiments.

FIG. 6 illustrates still another embodiment of a method 600 of using directional processing to remove a layer or a material formed over a substrate. FIG. 7A is a schematic diagram illustrating one embodiment of a substrate 702 processed by the method 600 of FIG. 6. In block 610, an anti-reflective coating 710 is deposited over a substrate 702. The substrate 702 includes a first region 704 and a second region 706 which provides a different micro-loading of a bottom layer or an anti-reflective coating 710. For example, the first region 704 may include a high density of features (holes, vias, trenches, openings) and the second 706 may include a low density of features (holes, vias, trenches, openings). In another example, the first region 704 may include one or more features with wider widths, such as one or more holes, vias, trenches with wider widths, than the second region 706. The different micro-loading of an anti-reflective coating 710 over the first region 704 and the second region 706 results in a different topography of the anti-reflective coating 710 in which the thickness 705 over the first region 704 is less than the thickness 707 over the second region 706. The uniformity of the anti-reflective coating 710 is affected by the topography of the features therebelow. The anti-reflective coating 710 may be an organic layer, such as a polymer layer, or an inorganic layer, such as a SiON layer. The anti-reflective coating 710 may be deposited by spin coating, CVD, ALD, evaporation, or any suitable deposition technology. The anti-reflective coating may be a bottom anti-reflective coating (BARC) which is used to reduce reflection during the photolithography process.

Figure 7B:
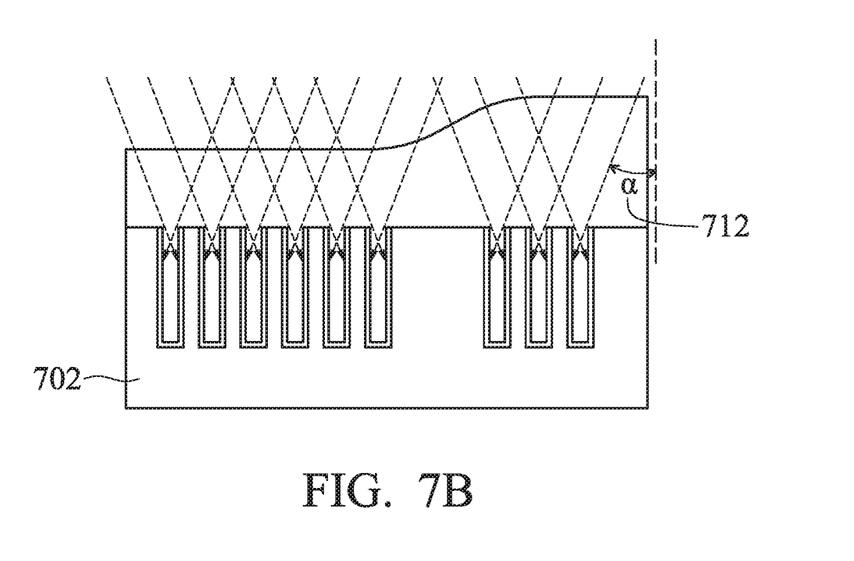

In block 620, a directional etch of the anti-reflective coating 710 is performed to remove the anti-reflective coating 710 from the top surface of the substrate 702 as shown in FIG. 7B. The directional etching may more quickly remove the anti-reflective coating 710 of the smaller thickness 705 over the first region 704 than the larger thickness 707 over the second region 706. As shown in schematic diagram of FIG. 7B and in FIG. 7C, the angle 712 of the etch ions during the directional etch is controlled so openings of the features in the first region 704 and the openings of the features in the second region 706 provide a shadowing effect to limit the amount of etch ions reaching the bottom of the feature. The angle 712 of the directional etch may be chosen based upon the aspect ratio (depth over width) of the openings of the features. For example, the angle 712 may be in a range from 2 degrees to 75 degrees. The angle 712 of the directional etch may be chosen based upon the desired depth of the etch ions into the features, such as in a range from 10 degrees to 60 degrees in certain embodiments.

Figure 7C:
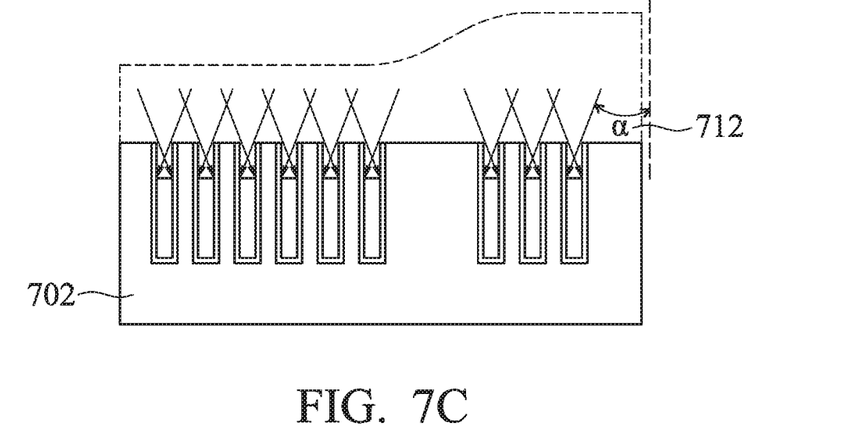

The directional etch may be performed using an IBE or an RIBE process. The IBE process may include an inert gas, such as argon gas, to generate ions which are collimated and directed to the substrate. The RIBE process may include a reactive gas with or without an inert gas. Reactive etchant gases includes, but is not limited to, $O_2$, $C_2F_6$, $CF_4$, $CHF_3$, $CH_2F_2$, $C_3F_8$, $C4F8$, $SF6$, $NF3$, $Cl_2$, HCl, $BCl_3$, other suitable reactive gases, and combinations thereof. The angle 712 of the ions during the IBE process or RIBE process may be controlled by tilting the substrate 702 with respect to an ion source, such as a collimated ion beam source. The substrate may rotate with respect to the ion source so that the substrate 702 may be uniformly etched by etch ions directed at the angle 712 along the z-axis.

Figure 7D:
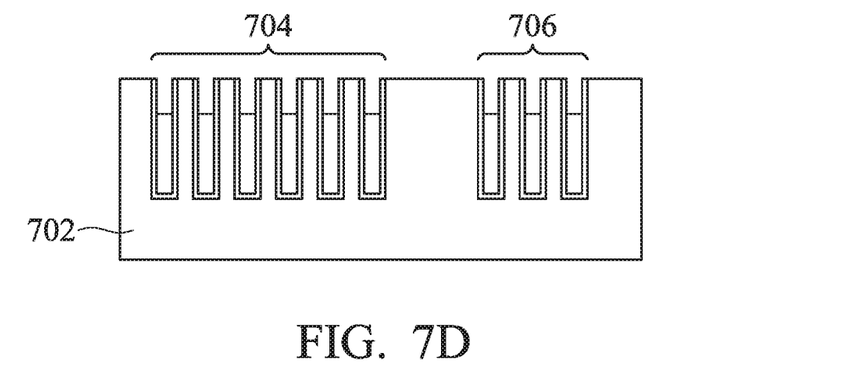

With uneven loading and uneven topography of the anti-reflective coating 710, directional etching may etch the anti-reflective coating 710 to the same height within the features of the first region 704 and the features of the second region 706 as shown in schematic diagram of FIG. 7D. The method of 600 removes a layer filling features without the cost and process complexity of using extra masks to address loading issues and topography issues.

Figure 8:
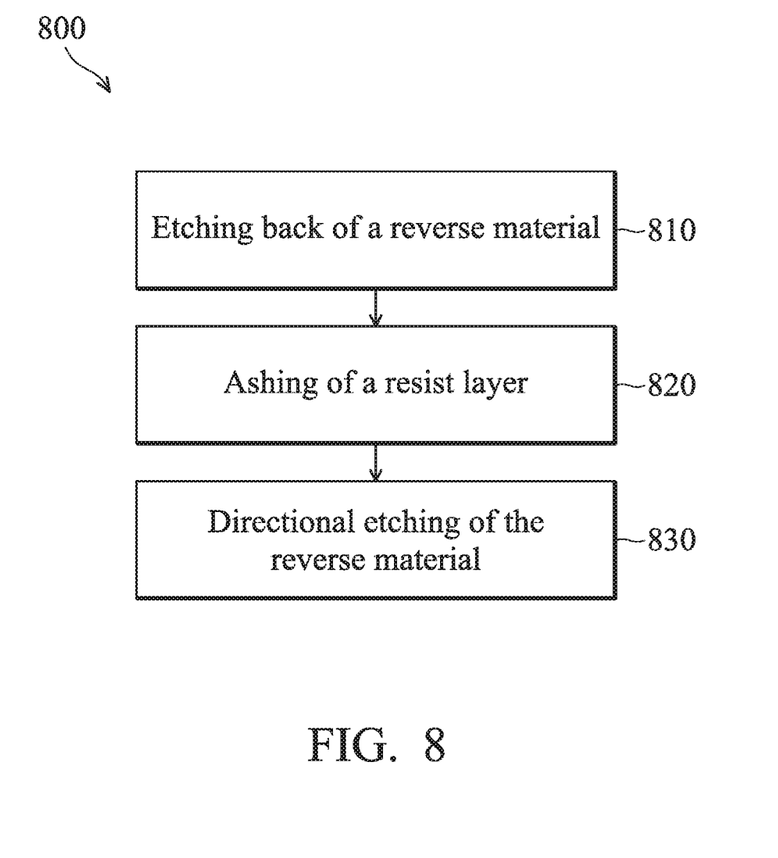
FIG. 8 is yet another method of using directional processing to remove a layer or a material formed over a substrate, in accordance with some embodiments.
Figure 9A:
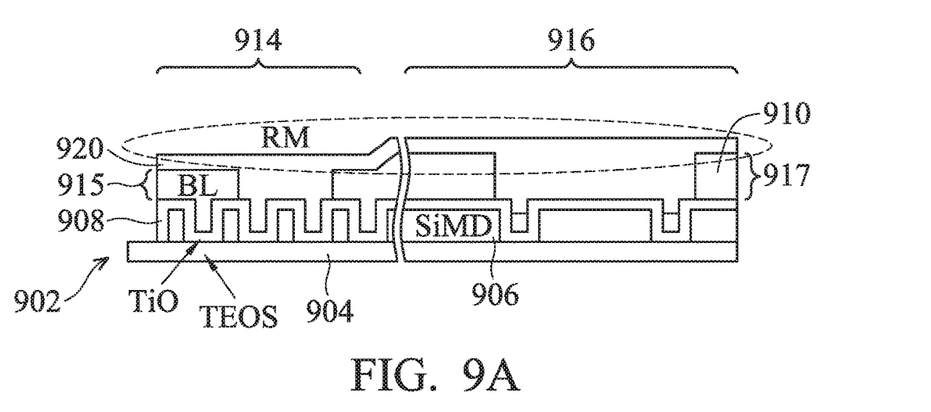
FIGS. 9A-9C are schematic diagrams of a substrate processed by the method of FIG. 8, in accordance with some embodiments.

FIG. 8 illustrates yet another embodiment of a method 800 of using directional processing to remove a layer or a material formed over a substrate. FIG. 9A is a schematic diagram illustrating one embodiment of a substrate 902 processed by the method 800 of FIG. 8. The substrate 902 includes a dielectric layer 904. For example, the dielectric layer 904 may be a silicon oxide layer formed by CVD or by ALD by flowing TEOS tetraethyl orthosilicate (TEOS) along with other precursor or carrier gases. An interlayer dielectric or middle dielectric layer 906 may be formed and patterned over the dielectric layer 904. A high-k layer 908, such as a titanium oxide layer, is formed over the middle dielectric layer.

A resist layer 910, such as a bottom antireflective coating (BARC) layer, is formed over the high-k layer 908. The substrate 902 includes a first region 914 and a second region 916 which provides a different micro-loading of the resist layer 910. For example, the first region 914 may include a high density of features (holes, via, trenches, openings) and the second region 916 may include a low density effect features (holes, via, trenches, openings). In another example, the first region 914 may include one or more features with wider widths, such as one or more trenches with wider widths, than the second region 916. The different micro-loading of the resist layer 910 over the first region 914 and the second region 916 results in a different topography of the resist layer 910 in which the thickness 915 over the first region 914 is less than the thickness 917 over the second region 916. The resist layer 910 is patterned to form a plurality of openings. A reverse material 920 is deposited over the patterned resist layer 910. Due to the different thickness 915 over the first region 914 and the thickness 917 over the second region 916 of the pattern resist layer 910, the topography of the reverse material 920 over the substrate 902 is uneven.

Figure 9B:
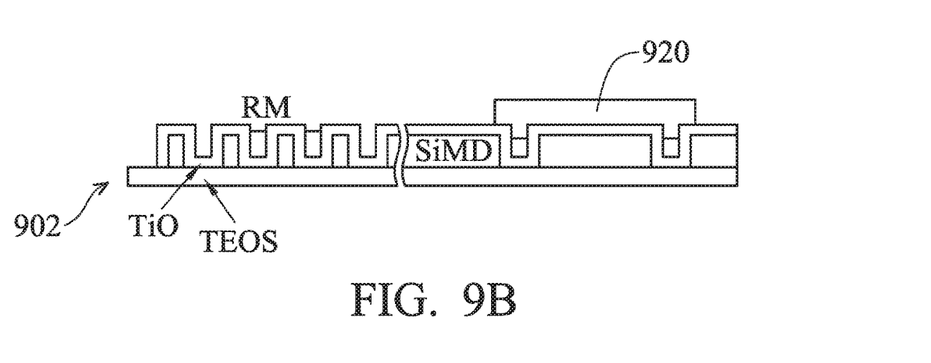

In block 810, the reverse material 920 is etched back to leave various portions of the reverse material over the first region 914 and the second region 916 of the substrate 902 as shown in a schematic diagram of FIG. 9B. The etching process may involve a plasma process, such as an ICP, parallel place plasma, IBE, or RIBE plasma process. The etching process includes an etching gas, such as $O_2$, $N_2$, Ar, $C_2F_6$, $CF_4$, $CHF_3$, $CH_2F_2$, $C_3F_8$, $C_4F_8$, $SF_6$, $NF_3$, $Cl_2$, HCl, $BCl_3$, other suitable etching gases, and combinations thereof. The etch back may also remove the resist layer 910 resulting in substrate 902 of FIG. 9B in which the reverse material 920 remains on the top surface of the substrate 902 and within the features of the substrate 902.

In block 820, an ashing process may be optionally performed to remove the resist layer 910, which also results in substrate 902 of FIG. 9B in which the reverse material 920 remains on the top surface of the substrate 920 and within the features of the substrate 920. For example, the ashing process may comprise exposing the resist layer 910 to an $O_2$ plasma.

Figure 9C:
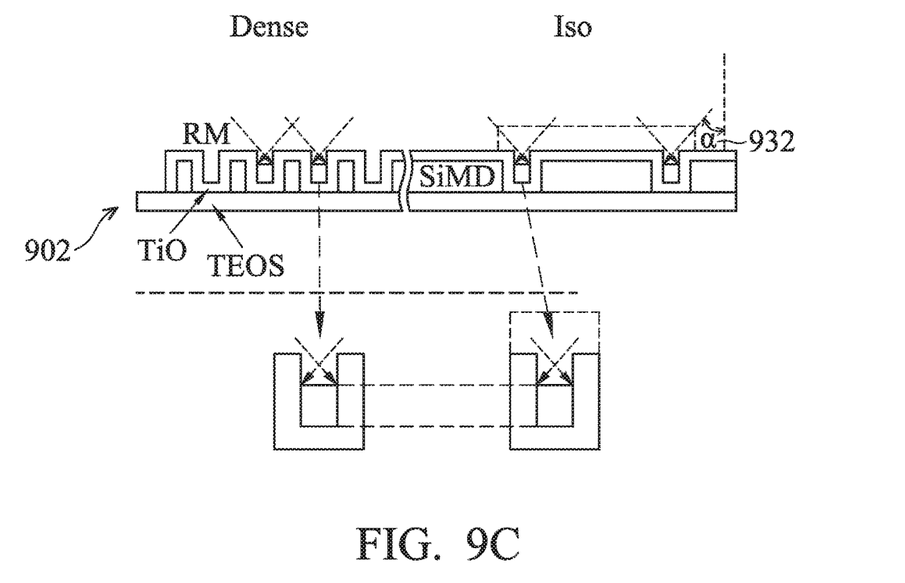

In block 830, a directional etch of the reverse material 920 is performed to remove the reverse material 920 from the top surface of the substrate 902 as shown in a schematic diagram of FIG. 9C. The angle 932 of the etch ions during the directional etch is controlled so openings of the features in the first region 914 and the openings of the features in the second region 916 provide a shadowing effect to limit the amount of etch ions reaching the bottom of the feature. The angle 932 of the directional etch may be chosen based upon the aspect ratio (depth over width) of the openings of the features. For example, the angle 712 may be in a range from 2 degrees to 75 degrees. The angle 932 of the directional etch may be chosen based upon the desired depth of the etch ions into the features, such as in a range from 10 degrees to 60 degrees in certain embodiments.

The directional etch may be performed using an IBE or an RIBE process. The IBE process may include an inert gas, such as argon gas, to generate ions which are collimated and directed to the substrate. The RIBE process may include a reactive gas with or without an inert gas. Reactive etchant gases includes, but is not limited to, $O_2$, $C_2F_6$, $CF_4$, $CHF_3$, $CH_2F_2$, $C_3F_8$, $C_4F_8$, $SF_6$, $NF_3$, $Cl_2$, HCl, $BCl_3$, other suitable reactive gases, and combinations thereof. The angle 932 of the ions during the IBE process or RIBE process may be controlled by tilting the substrate 902 with respect to an ion source, such as a collimated ion beam source. The substrate may rotate with respect to the ion source so that the substrate 902 may be uniformly etched by etch ions directed at the angle 932 along the z-axis. Although the uneven height the resist layer 910 results in a uneven topography of the reverse material 920, directional etching may etch the reverse material to the same height within the features of the first region 914 and the features of the second region 916.

Embodiments of the present disclosure use directional processing, such as directional etching and directional implant, to use the intrinsic shadowing effect to provide uniform removal of a layer or a material over a substrate or within features (holes, vias, trenches, openings, etc.) of a substrate. A directional etch or directional implant plus etch may be used to remove materials without damaging the layer therebelow. A directional etch or directional implant plus etch may be used to remove materials formed with varying topographies over a substrate without the cost of using extra masks and/or patterning steps. By using the intrinsic shadowing effect of features during directional processing, the z-directional etch profile may be controlled enhancing semiconductor process and integration stability. For example, directional processing may be used to achieve uniform etch of resists having different loading in a cut-metal process.

Other directional processing techniques, which may also be used in embodiments consistent with the present disclosure, include directional hardening (such as using rapid thermal anneal (RTP) lamp heating chambers), directional deposition (such as using collimated PVD sputtering chambers), and other directional processing techniques.

One embodiment of a method of fabricating a semiconductor device includes forming a hard mask layer over a substrate. A multi-layer resist is formed over the hard mask layer. The multi-layer resist is etched to form a plurality of openings in the multi-layer resist to expose a portion of the hard mask layer. Ion are directionally provided at an angle to the multi-layer resist to predominately contact sidewalls of the plurality of openings in the multi-layer resist rather than the hard mask layer. The angle of the ion directionally provided may be determined based upon an aspect ratio of the plurality of openings.

In one embodiment, the multi-layer resist is directionally etched by directing etch ions at an angle to predominately contact sidewalls of the plurality of openings in the multi-layer resist rather than the hard mask layer. One example of a directionally etching process includes ion beam etching or other suitable etch processes.

In another embodiment a method of fabricating a semiconductor device includes forming a hard mask layer over a substrate. A multi-layer resist is formed over the hard mask layer. The multi-layer resist is etched to form a plurality of openings in the multi-layer resist to expose a portion of the hard mask layer. The multi-layer resist is directionally implanted by directing implant ions at an angle to predominately contact sidewalls of the plurality of openings in the multi-layer resist rather than the hard mask layer.

In still another embodiment, a method of fabricating a semiconductor device includes depositing an anti-reflective coating over a substrate. The substrate includes a first region having a plurality of features and a second region having a plurality of features. The anti-reflective coating forms to a different thickness over the first region and the second region. The anti-reflective coating is directionally etched to a same height within the features of the first region and within the features of the second region. For example, directionally etching the anti-reflective coating includes directing etch ions at an angle to the anti-reflective coating.

In yet another embodiment, a method of fabricating a semiconductor device includes etching back a reverse material over a substrate. The substrate includes a first region having a plurality of features and a second region having a plurality of features. The reverse material is directionally etched to a same height within the features of the first region and the features of the second region.

In one embodiment, a semiconductor device structure includes a sacrificial structure formed over a substrate. The sacrificial structure includes a multi-layer resist, an anti-reflective coating, a revise material, or other suitable structures. A plurality of openings within the substrate or within the sacrificial structure is formed. The plurality of openings provides a shadowing effect to limit ions directed at an angle to reach a bottom of the plurality of openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device over a substrate having a multi-layer resist over a hard mask layer, the method comprising:
   etching the multi-layer resist to form a plurality of openings in the multi-layer resist to expose a portion of the hard mask layer; and
   directionally providing ions at an angle to the multi-layer resist to predominately contact sidewalls of the plurality of openings in the multi-layer resist rather than the hard mask layer,
   wherein the multi-layer resist comprises a bottom layer, a middle layer formed over the bottom layer, and a top photoresist layer formed over the middle layer and wherein the middle layer and the hard mask layer have a similar etch selectivity to an etch chemistry of the directional etch process.

2. The method of claim 1, wherein the plurality of openings provide a shadowing effect to limit the ions directionally provided from contacting the hard mask layer.

3. The method of claim 1, wherein the ions are directionally provided by an directional etch process.

4. The method of claim 1, further comprising:
   patterning the top photoresist layer to form a top photoresist layer mask; and
   etching the middle layer through the top photoresist layer mask to form a middle layer mask.

5. The method of claim 4,
   wherein the etching the multi-layer resist to form the plurality of openings in the multi-layer resist comprises etching the bottom layer through the middle layer mask to form a plurality of openings in the bottom layer; and
   wherein the directional etch process removes the middle layer mask.

6. The method of claim 5, wherein the directional etch process comprises directing etch ions to predominately contact sidewalls of the middle layer and the bottom layer rather than the hard mask layer.

7. The method of claim 1, wherein the ions are directionally provided by an directional implant process.

8. The method of claim 7, wherein the etching the multi-layer resist to form the plurality of openings in the multi-layer resist comprises etching a bottom layer through a middle layer mask to form a plurality of openings in the bottom layer; and
   wherein the directional implant process comprises directing implant ions to predominately contact sidewalls of the middle layer mask rather than bottom layer and rather than the hard mask layer.

9. The method of claim 7, wherein the etching the multi-layer resist to form the plurality of openings in the multi-layer resist comprises etching a bottom layer through a middle layer mask to form a plurality of openings in the bottom layer; and
   wherein the directional implant process softens the middle layer mask.

10. The method of claim 9, further comprising etching the multi-layer resist by softening the middle layer mask prior to removing the middle layer mask from the multi-layer resist.

11. A method of manufacturing a semiconductor device, the method comprising:
    forming a hard mask layer over a substrate;
    forming a bottom layer over the hard mask layer;
    forming a middle layer over the bottom layer;
    forming a photo resist pattern over the middle layer;
    patterning the middle layer by using the photo resist pattern as an etching mask;
    removing the photo resist pattern from the patterned middle layer;
    patterning the bottom layer by using the patterned middle layer based on the photo resist pattern as another etching mask; and
    selectively etching the patterned middle layer with respect to the hard mask layer by using a directional etching process.

12. The method of claim 11, wherein the middle layer is made of a first silicon containing material and the hared mask layer is made of a second silicon containing material.

13. The method of claim 11, further comprising softening the patterned middle layer prior to removing the patterned middle layer.

14. The method of claim 11, wherein:
the direction etching process employs a plasma etching process, and
etch ions generated by plasma are supplied to the patterned middle layer with an angle α with respect to a normal direction of the substrate, such that the etch ions do not cause damage to the hard mask layer.

15. The method of claim 14, wherein the angle α is adjusted based on an aspect ratio of the patterned middle layer and the patterned bottom layer.

16. The method of claim 14, wherein the angle α is in a range from 5 degrees to 30 degrees.

17. A method of manufacturing a semiconductor device, the method comprising:
forming a hard mask layer over a substrate;
forming a bottom layer over the hard mask layer;
forming a middle layer over the bottom layer;
forming a photo resist pattern over the middle layer;
patterning the middle layer by using the photo resist pattern as an etching mask;
removing the photo resist pattern from the patterned middle layer;
patterning the bottom layer by using the patterned middle layer based on the photo resist pattern as another etching mask;
selectively implanting ions to the patterned middle layer with respect to the hard mask layer by using a directional ion implantation process; and
removing the patterned middle layer.

18. The method of claim 17, wherein:
implantation ions are supplied to the patterned middle layer with angles ±α with respect to a normal direction of the substrate, such that the implantation ions do not reach the hard mask layer.

19. The method of claim 18, wherein a is in a range from 5 degrees to 30 degrees.

20. The method of claim 18, wherein the implantation ions include carbon, and the removing the patterned middle layer includes causing carbons in the middle layer to be converted to carbon dioxide.

* * * * *